(12) United States Patent
Noguchi

(10) Patent No.: US 6,353,905 B1
(45) Date of Patent: Mar. 5, 2002

(54) SEMICONDUCTOR INTEGRATED CIRCUIT AND RECORDING MEDIUM

(75) Inventor: Koki Noguchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/609,473

(22) Filed: Jun. 30, 2000

(30) Foreign Application Priority Data

Jul. 28, 1999 (JP) .......................................... 11-213165

(51) Int. Cl.$^7$ .......................... G01R 31/28; G06F 11/00
(52) U.S. Cl. ....................... 714/728; 714/729; 714/738
(58) Field of Search ................................. 714/724, 726, 714/727, 728, 729, 731, 738, 744

(56) References Cited

U.S. PATENT DOCUMENTS

| | | | |
|---|---|---|---|
| 5,150,044 A | * 9/1992 | Hashizume et al. | 324/763 |
| 5,321,277 A | * 6/1994 | Sparks et al. | 257/48 |
| 5,477,545 A | * 12/1995 | Huang | 714/727 |
| 5,590,354 A | * 12/1996 | Klapproth et al. | 714/30 |
| 5,598,421 A | * 1/1997 | Tran et al. | 714/726 |
| 5,627,842 A | * 5/1997 | Brown et al. | 714/727 |
| 5,636,227 A | * 6/1997 | Segars | 714/729 |
| 5,751,736 A | * 5/1998 | Deroux-Dauphin et al. | 714/726 |
| 5,774,477 A | * 6/1998 | Ke | 714/727 |
| 5,862,152 A | * 1/1999 | Handly et al. | 714/727 |
| 6,000,051 A | * 12/1999 | Nadeau-Dostie et al. | 714/727 |
| 6,073,254 A | * 6/2000 | Whetsel | 714/30 |
| 6,115,763 A | * 9/2000 | Douskey et al. | 710/72 |

FOREIGN PATENT DOCUMENTS

| | | |
|---|---|---|
| JP | 3-42850 | 2/1991 |
| JP | 5-264664 | 10/1993 |
| JP | 6-201780 | 7/1994 |
| JP | 8-220192 | 8/1996 |

* cited by examiner

Primary Examiner—Albert Decady
Assistant Examiner—Joseph Torres
(74) Attorney, Agent, or Firm—Mattingly, Stanger & Malur, P.C.

(57) ABSTRACT

Disclosed herein are a semiconductor integrated circuit and a recording medium wherein the amount of test data inputted from and outputted to the outside to test a plurality of circuit modules and the amount of test result data are reduced and a test time interval is shortened. When each of tested circuits is tested, test control information is externally inputted to a test interface circuit, and test control information is set to each of scan registers of circuit modules to be tested, through a test signal chain. When an instruction for a test operation is given to each of test control circuits through a control terminal, a test circuit allows the tested circuits to be tested based on the test control information on a parallel basis. Test results are read into the test interface circuit from the scan registers through the test signal chain, followed by output to the outside. The test operations for the circuit modules can be parallelized and the test interface circuit can be shared between the respective circuit modules.

13 Claims, 8 Drawing Sheets

SEMICONDUCTOR INTEGRATED CIRCUIT AND RECORDING MEDIUM

BACKGROUND OF THE INVENTION

The present invention relates to a test facilitation technique incorporated into a semiconductor integrated circuit, and to a technique effective for application to a semiconductor integrated circuit in which, for example, JTAG (Joint Test Action Group) has been adopted as a boundary scan standard.

As a test facilitation technique used for a semiconductor integrated circuit, a structure has been widely adopted which performs a test operation while a scan path is caused to transfer scan data in synchronism with a scan clock upon the test operation, and scans out the result thereof.

Japanese Patent Application Laid-Open No. Hei 3-42850 has described an invention wherein when a test mode is specified or designated from the outside of a semiconductor integrated circuit, scan data is automatically generated thereinside and thereby a burn-in test is allowed through a scan path. An invention has been described in Japanese Patent Application Laid-Open No. Hei 6-201780, wherein a test pattern generator is placed at the input of a scan chain and a test output compressor is placed at the output of the scan chain, whereby the shortening of a test time interval is set up. Japanese Patent Application Laid-Open No. Hei 5-264664 has described a technique related to boundary scan using a TAP controller and wherein a clock is supplied only to each of registers to be tested in accordance with the result of decoding of an instruction issued from the TAP controller, thereby achieving low power consumption.

Japanese Patent Application Laid-open No. Hei 5-264664 has disclosed a description related to an invention wherein a test enable signal and a test clock signal are respectively supplied in parallel to a plurality of semiconductor integrated circuits each having a self-test circuit incorporated therein and self-test mechanisms are simultaneously operated to carry out troubleshooting, whereby a test time interval is shortened. Japanese Patent Application Laid-Open No. Hei 8-220192 has disclosed a description related to an invention wherein inspection control LSI is implemented on a single circuit printed board together with a plurality of tested LSI which are addressed and have chains of scannable flip-flop respectively, and the inspection control LSI has a pseudo-random number generator and a code compressor and writes a pseudo random number into its corresponding flip-flop upon scan-in and supplies data of each flip-flop to the code compressor upon scan-out, thereby making it possible to achieve the facilitation and speeding up of troubleshooting.

SUMMARY OF THE INVENTION

The present inventors have investigated or discussed a device test on a semiconductor integrated circuit equipped with a plurality of pieces of circuit modules (corresponding to functional units also called functional modules) relatively large in logic scale as in a memory, a CPU or the like. According to the result of discussions, they have revealed the necessity for reducing the amount of test data to be supplied from the outside and the amount of data about test results to be outputted to the outside and parallelizing test operations for circuit modules to thereby shorten test times with a view toward improving the efficiency of testing. In order to reduce a logical and physical scale of a circuit necessary for testing to the utmost, a circuit for performing the input and output of test data and result data to and from the respective circuit modules needs to be shared between the respective circuit modules. Further, when JTAG is adopted as the standard for boundary scan for inspecting an electrical connection between a semiconductor integrated circuit to which a surface mounting package like BGA (Ball Grid Array) is applied, and a printed circuit board, such a JTAG controller as used for the boundary scan alone is appropriated to other tests. Thus, this will be useful to reduce the logical and physical scale of the test circuit. Any prior art will not be enough for these points.

An object of the present invention is to provide a semiconductor integrated circuit capable of reducing the amount of test data to be supplied from the outside and the amount of data about test results to be outputted to the outside in order to test a plurality of circuit modules, and shortening the time required to test the plurality of circuit modules.

Another object of the present invention is to provide a semiconductor integrated circuit wherein the scale of a test circuit required to test a plurality of circuit modules can be reduced as small as possible.

A further object of the present invention is to provide design data capable of facilitating the design of a semiconductor integrated circuit which implements the shortening of a test time and a reduction in the scale of a test circuit.

The above, and other objects and novel features of the present invention will become apparent from the description of the present specification and the accompanying drawings.

Summaries of typical ones of the inventions disclosed in the present application will be described in brief as follows:

[1] A semiconductor integrated circuit comprises a single semiconductor chip including a plurality of circuit modules each provided with a test input terminal, a test output terminal and a test control terminal, a test path which connects the test output terminal of one circuit module to the test input terminal of the other circuit module to thereby form a test signal chain, and a test interface circuit connected to the test path. Each circuit module has a tested circuit, a test register circuit and a test control circuit. The test register circuit is connected to the test path through the test input terminal and the test output terminal and permits input and output to and from the test control circuit. The test control circuit receives a start for a test on the tested circuit from the test control terminal to thereby perform the test using test control information outputted from the test register circuit and supplies information about the result of test to the test register circuit. The test interface circuit supplies the test control information to the test register circuit from the outside through a test path and outputs the information about the result of test from the test register circuit to the outside through the test path.

When each of the tested circuits is tested, test control information can be externally inputted to a test interface circuit, and the test control information can be set to each of the test register circuits in all the circuit modules to be tested, through a test path corresponding to a test signal chain from the test interface circuit. Thereafter, when an instruction for a test operation is given to each of the test control circuits through a control terminal, a test circuit allows the tested circuits to be tested based on the test control information on a parallel basis. Information about test results are held in each individual test register circuits. Afterwards, the information held in the test register circuits in all the circuit modules to be tested are read into the test interface circuit through the test path corresponding to the test signal chain and outputted to the outside. Thus, the test operations for the circuit modules can be parallelized and hence a test time interval can be shortened. Since the test interface circuit, which performs the input and output of the test control information and test result data to and from the circuit modules, can be shared between the respective circuit modules, this can contribute even to a reduction in logical/ physical scale of a circuit necessary for testing.

[2] A test pattern generator and a compressor may be adopted for the test control circuit. The test pattern generator generates a test pattern for each test circuit, based on the test control information inputted to the test register circuit. The compressor compresses the result of operation of the tested circuit to thereby generate information about the result of test and supplies the same to the test register circuit. The test control information may be placed as a test command for specifying or indicating the contents of each test operation. The test pattern generator decodes the test command and thereby generates a test pattern.

Thus, the amount of the test control information sent from the test interface circuit to each of the test register circuits and the amount of operation-result information sent from the test register circuit to the test interface circuit can be reduced, thereby making it possible to contribute to an improvement in test efficiency.

[3] If the control terminals of the plurality of circuit modules are connected in common and coupled to the test interface circuit, then instructions for test operations can be given to the plurality of circuit modules on a parallel basis and besides the number of signals for their instructions can be limited to the minimum.

[4] The test path may adopt, for example, a configuration of a scan path which series-connects the plurality of test register circuits with the test interface circuit as a base point and is fed back to the test interface circuit. At this time, a transfer control clock may be generated by the test interface circuit.

In this case, the test register circuit may comprise, for example, a plural-bits type shift register having a serial input terminal connected to the test input terminal, a serial output terminal connected to the test output terminal, a parallel output terminal connected to the pattern generator, and a parallel input terminal connected to the compressor.

The test path is not limited to the case where paths having connected the test register circuits in series are formed in a single system. They may comprise plural systems. If configured in the plural systems, then the time required to transfer the test control information and the test result information through the test path can be further shortened.

[5] If one of the plurality of circuit modules is, for example, a cache memory or a random access memory, then the efficiency of a memory test which requires time for testing in general, can be improved, and the effect of improving test efficiency can be taken out to the maximum.

When the plurality of circuit modules include a first circuit module connected to a common bus, and a second circuit module connected to the first circuit module and disconnected from the common bus, an efficient test can be made even on the second circuit module on which a test cannot be made via the common bus, in a manner similar to the first circuit module.

Such a second circuit module is often used as a local memory such as a local data buffer in a controller for processing communication-system and storage-system data. Assuming such a case, a memory test can be efficiently made even on a local memory on which a test cannot be made via a common bus, in such a system LSI as brought into system on-chip.

[6] The test interface circuit has, for example, a clock terminal, a mode terminal, a data input terminal and a data output terminal as external terminals. The test interface circuit may be configured in such a manner that when a first operation mode is specified through the mode terminal, it captures information supplied to the data input terminal and delivers the captured information to the test path, when a second operation mode is specified through the mode terminal, it captures information supplied to the data input terminal and decodes the captured information to thereby output a control signal to the test control terminal, and when a third operation mode is specified through the mode terminal, it captures information of each test register circuit through the test path and outputs the same from the data output terminal to the outside.

Described more specifically, the test interface circuit having the above-described specific configuration may perform the input/output of a signal in accordance with a procedure which complies with the standard of IEEE1149.1. This standard is based on JTAG which is the standard for the boundary scan. Since such a JTAG controller as used for the boundary scan can be shared for a principal interface function of a test interface circuit, it is useful for the effective use of JTAG controller or a further reduction in the scale of a testing circuit.

[7] Judging the design of the semiconductor integrated circuit from the viewpoint of its facilitation, design data for the circuit modules or design data for the semiconductor integrated circuit itself may be provided as so-called IP (Intellectual Property) modules. The IP modules are roughly classified into a hard IP module having even circuit's mask pattern data or graphics-drawing data together with function descriptive data such as HDL (Hardware Description Language), RTL (Register Transfer Language), and a soft IP module comprised principally of function descriptive data. Circuit module data like the IP modules is circuit module data for designing an integrated circuit to be formed on a semiconductor chip, by using a computer, and is stored in and provided from a storage medium so as to be readable by the computer.

Circuit module data includes graphics pattern data or function descriptive data for forming, on the semiconductor chip, a test input terminal, a test output terminal, a test control terminal, a normal interface terminal, at least one tested circuit connected to the normal interface terminal, at least one test register circuit which inputs information from the test input terminal and outputs the information to the test output terminal, and at least one test control circuit which receives a start for a test on the tested circuit from the control terminal to thereby perform the test using test control information outputted from the test register circuit and supplies information about the result of test to the test register circuit.

The scale of each IP module might reach up to an LSI level. When the scale is regarded in this way, the items of circuit module data are respectively provided for a plurality of circuit modules different in tested circuit from one another. Further, test path data used as graphics pattern data or function descriptive data for forming, on a semiconductor chip with the plurality of circuit modules formed thereon, a test path for connecting a test output terminal of one circuit module to a test input terminal of another circuit module to thereby constitute a test signal chain is provided for each circuit module. Furthermore, test interface circuit information may further be included as graphics pattern data or function descriptive data for forming, on the semiconductor chip, a test interface circuit which supplies the test control information from the outside to the test register circuit through the test path and outputs information about the result of test from the test register circuit to the outside through the test path.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings.

Figure 2:
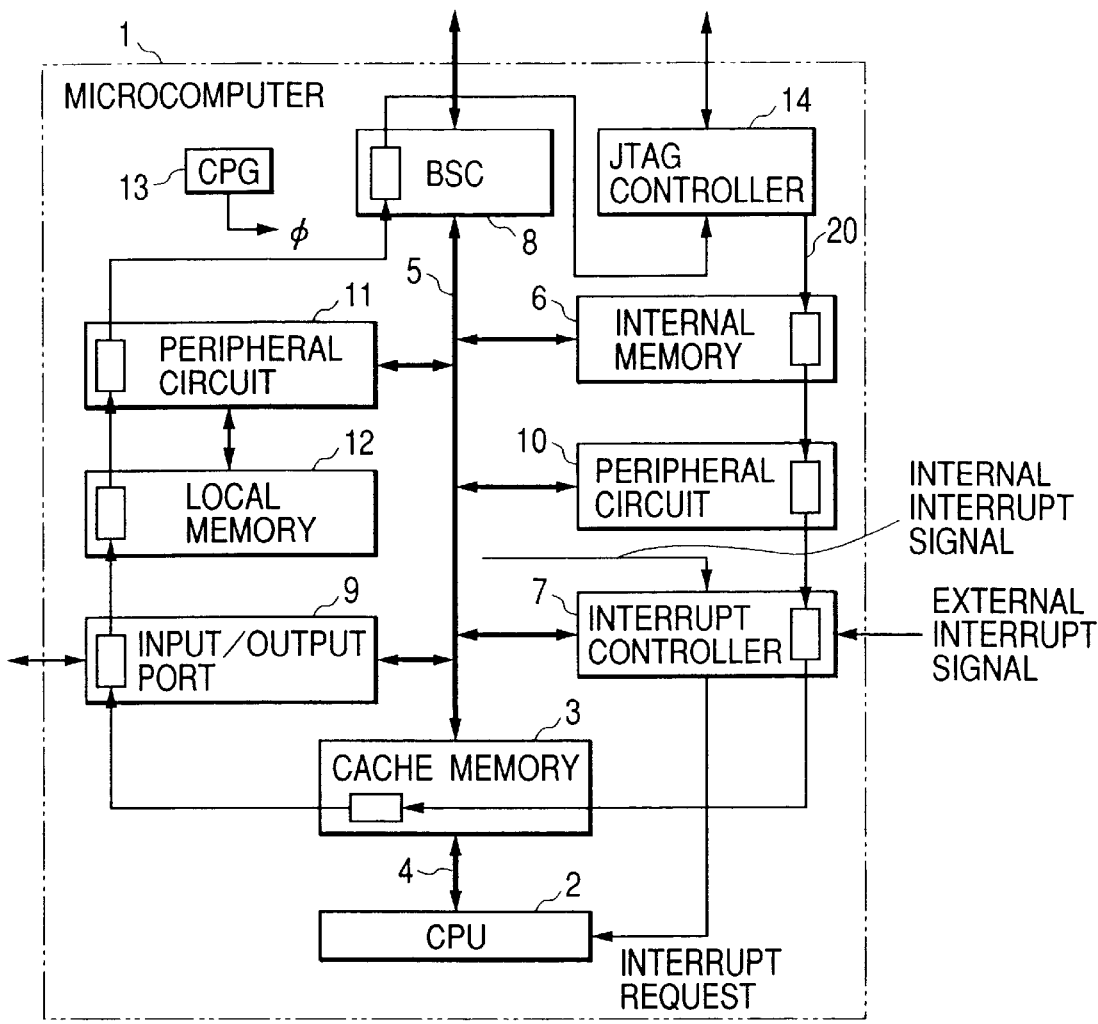
FIG. 2 is a block diagram illustrating on the whole, a microcomputer which is one example of a semiconductor integrated circuit according to the present invention.

A microcomputer is shown in FIG. 2 as one example of a semiconductor integrated circuit according to the present invention. Although not restricted in particular, the microcomputer 1 shown in the same drawing is formed on a single semiconductor chip like monocrystalline silicon by the semiconductor integrated circuit manufacturing technology known to date.

The microcomputer 1 has a central processing unit (CPU) 2 and a cache memory 3 as circuit modules. Both of them are connected to each other through a cache bus 4. The cache memory 3 is coupled to an internal bus 5 used as a common bus. Further, an internal memory 6 accessible by the CPU 2, an interrupt controller 7 for controlling an interruption made to the CPU 2, a bus state controller (BSC) 8 for controlling an external bus cycle, an input/output port 9, and peripheral circuits 10 and 11 typically shown in the drawing as two, which are accessible by the CPU 2, are connected to the internal bus 5 as other circuit modules respectively. The microcomputer 1 is activated in synchronism with a basic clock signal φ outputted from a clock pulse generator (CPG) 13.

The internal memory 6 is a non-volatile memory like a dynamic random access memory (DRAM), a static random access memory (SRAM) or an electrically erasable and programmable flash memory. The cache memory 3 may be any of an instruction cache memory, a data cache memory, and a data/instruction mixed type unified cache memory and comprises, for example, the SRAM.

The peripheral circuit 10 is comprised of a suitable circuit such as a timer, a serial input/output circuit or the like. The peripheral circuit (first circuit module) 11 is a circuit which is connected to a local memory (second circuit module) 12 used for a local data buffer or the like unplaced in an address space of the CPU 2 and which is activated using the local memory 12. In the example shown in FIG. 2, the local memory 12 is kept in a state of being disconnected from the internal bus 5. Assuming that, for example, the peripheral circuit 11 is an arithmetic circuit dedicated for error correction, the local memory 12 is used as an error-correction processing data buffer.

The microcomputer 1 has a JTAG controller 14 for a test. Although not shown in the drawing in particular, a package for the microcomputer 1 is configured as a surface mounting type like a BGA, for example. The JTAG controller 14 has a control function for checking the state of connection between a printed circuit board and an external terminal according to boundary scan and is at least provided with a signal input/output function which complies with the standard of IEEEE1149.1. Further, the JTAG controller 14 has the function of performing a signal interface with the outside for purposes of self-tests on the respective circuit modules. An electrical connection between each of circuit modules to be tested and the JTAG controller 14 is done by a scan path 20 used as a test path. In the example shown in FIG. 2, the circuit modules to be tested using the scan path 20 may include the internal memory 6, the peripheral circuit 10, the interrupt controller 7, the cache memory 3, the input/output port 9, the local memory 12, the peripheral circuit 11 and the bus state controller 8.

Figure 1:
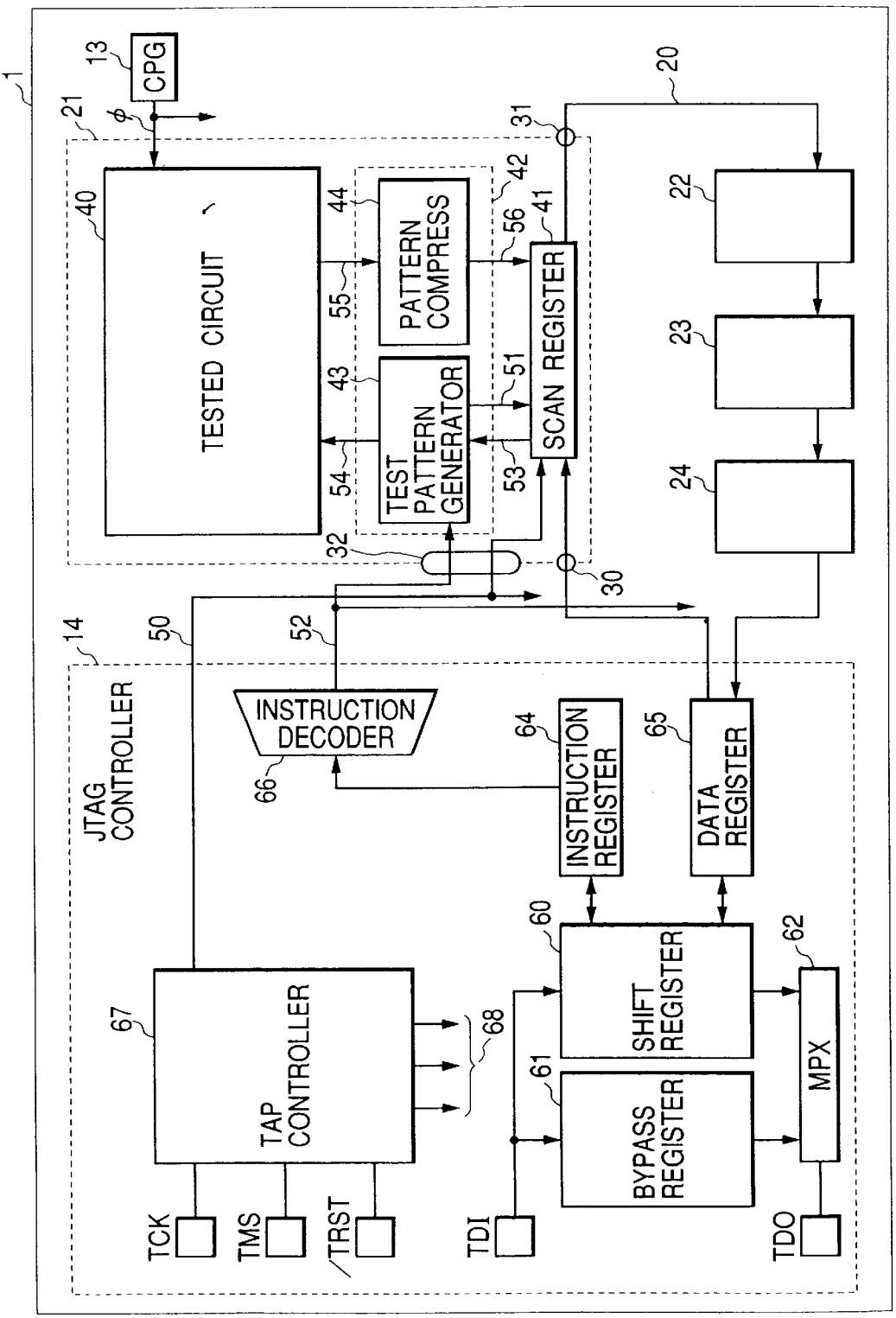
FIG. 1 is a block diagram showing a microcomputer according to one embodiment of the present invention while attention is being given to a self-test using a scan path.

FIG. 1 shows the microcomputer 1 with attention being given to the self-test using the scan path. A relationship between connections with the internal bus 5 and the cache bus 4 is omitted from the drawing.

In FIG. 1, the circuit modules to be tested (hereinafter also called "test modules") are designated at numerals 21 through 24 for convenience. The plurality of tested modules 21 through 24 respectively have a test input terminal 30, a test output terminal 31 and a test control terminal 32 as testing module interface terminals as typified by the tested module 21. The scan path 20 connects the test output terminal 31 used for one tested module to the test input terminal 30 used for the other tested module, so that a test signal chain is formed by a serial signal path.

Figure 3:
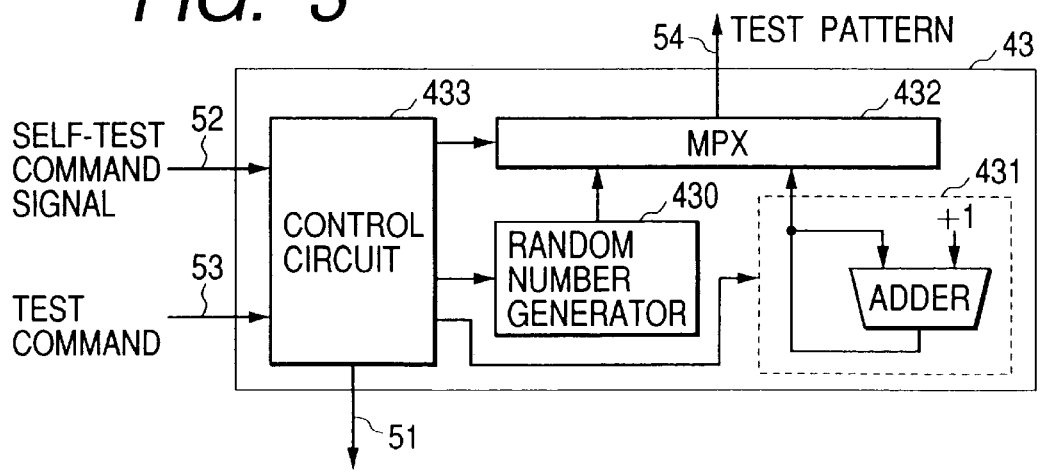
FIG. 3 is a block diagram depicting one example of a test pattern generator.

Each of the tested modules 21 through 24 has a tested circuit 40, a scan register (test register circuit) 41 and a test control circuit 42 as typified by the tested module 21. The test control circuit 42 adopts or utilizes a test pattern generator 43 and a compressing circuit or compressor 44. The test pattern generator 43 generates a test pattern 54 to be sent to the tested circuit 40, based on a test command (test control information) 53 inputted to the scan register 41. As shown in FIG. 3 by way of example, the test pattern generator 43 can comprise a random number generator 430, an adder 431 for feedback inputting an output signal to thereby add +1 thereto, a multiplexer 432 for selecting either the output of the random number generator 430 or the output of the adder 431, and a control circuit 433 for decoding the test command to thereby control the operations of the random number generator 430, the adder 431 and the multiplexer 432. The operation of generating a test pattern by the test pattern generator 43 is started while it waits for a self-test command signal 52 to be enabled.

The compressor 44 compresses a signal 55 obtained according to the operation of the tested circuit 40 to thereby generate test result data (information about the result of test) 56 and thereafter supplies it to the scan register 41.

Figure 4:
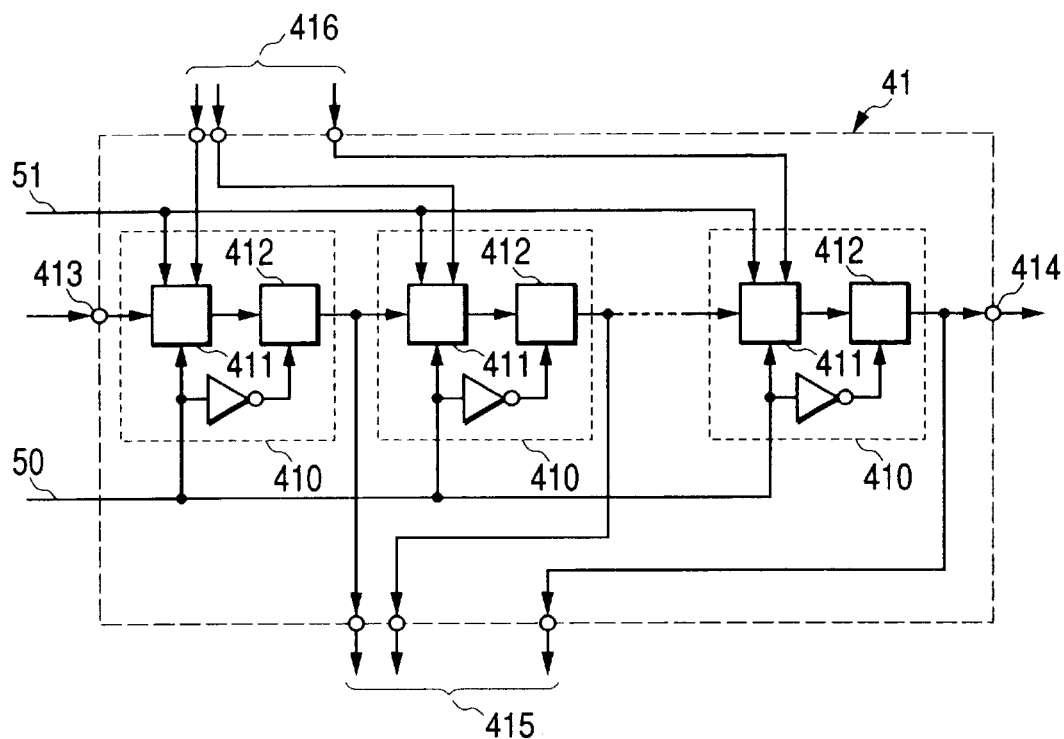
FIG. 4 is a block diagram showing one example of a scan register.

The scan register 41 is comprised principally of a shift register which is connected to the scan path 20 through the test input terminal 30 and the test output terminal 31 and performs a shift operation in bit serial in response to a scan path control clock signal 50. Further, the scan register 41 is capable of performing parallel output to the test pattern generator 43 and parallel input from the pattern compressor 44. FIG. 4 shows one detailed example of the scan register 41. n memory or storage stages 410 connected in series have input gates 411 and latches 412 respectively. Serial input from a serial input terminal 413 and serial output to a serial output terminal 414 are successively carried out in synchronism with a change in the level of the scan path control clock signal 50. Parallel outputs from parallel output terminals 415 are pull out or drawn from output nodes of each individual storage stages 410 respectively. Further, parallel inputs from parallel input terminals 416 are respectively selected with timing provided to change a test operation end signal 51 outputted from the test pattern generator 43 to an enable level.

The JTAG controller 14 shown as one example of a test interface circuit has a test clock terminal TCK, a test mode select terminal TMS, a test reset terminal/TRST, a test data input terminal TDI, and a test data output terminal TDO as external interface terminals for serially performing the input/output of information in asynchronism with the outside of the microcomputer 1. Although not restricted in particular, the JTAG controller 14 has a shift register 60, a bypass register 61, a multiplexer 62, an instruction register 64, a data register 65, an instruction decoder 66 and a TAP controller 67 in order to perform interface control using these five terminals.

The shift register 60 serially inputs serial data inputted to the test data input terminal TDI in synchronism with a shift clock included in a signal 68 outputted from the TAP controller 67. The serially-input data is parallel-inputted to the instruction register 64 or data register 65. Selecting either of them is determined according to the control signal 68. The command or instruction supplied to the instruction register 64 is supplied in parallel to the instruction decoder 66 according to instructions based on a control signal 68. When the instruction supplied to the instruction decoder 66 is of code data for a self-test start command, the instruction decoder 66 brings the self-test command signal 52 to an enable level. The data stored in the data register 65 is serially outputted to the scan path 20 in synchronism with the scan path control clock signal 50. Further, the data register 65 is capable of serially inputting data from the scan path 20 in synchronism with the scan path control clock signal 50. The data serially inputted to the data register 65 from the scan path 20 is transferred in parallel to the shift register 60. The parallel-transferred data is serially outputted from the shift register 60 in synchronism with the shift clock. The bypass register 61 is a one-bit register for connecting the test data input terminal TDI and the test data output terminal TDO. The multiplexer 62 selects either the serial output of the shift register 60 or the output of the bypass register 61 and supplies it to the test data output terminal TDO. Although omitted from the drawing shown in FIG. 1, each flip-flop called boundary scan cell is added to the external terminal of the microcomputer 1 for purposes of boundary scan. A configuration in which all boundary scan cells are connected so as to function as one shift register (boundary scan register) whose data is inputted from the test data input terminal TDI and outputted to the test data output terminal TDO, is also added to the external terminal thereof.

The operation of performing the input/output of the data through the test data terminals TDI and TDO is controlled according to the control signal 68 outputted from the TAP controller 67. The TAP controller 67 is defined as a so-called state machine which generates a control signal 68 according to state transition control. That is, internal control states are successively transitioned with respect to a predetermined state transition model according to whether a logical value at the test mode select terminal TMS is changed to "1" or "0" with respect to the present logical value. In other words, the direction in which the control state progresses from the present state to the next state, is determined according to the logical value of a signal applied to the test mode select terminal TMS.

The state of the control signal 68 represented in plural bits is determined according to the successively-transitioned individual control states.

Figure 5:
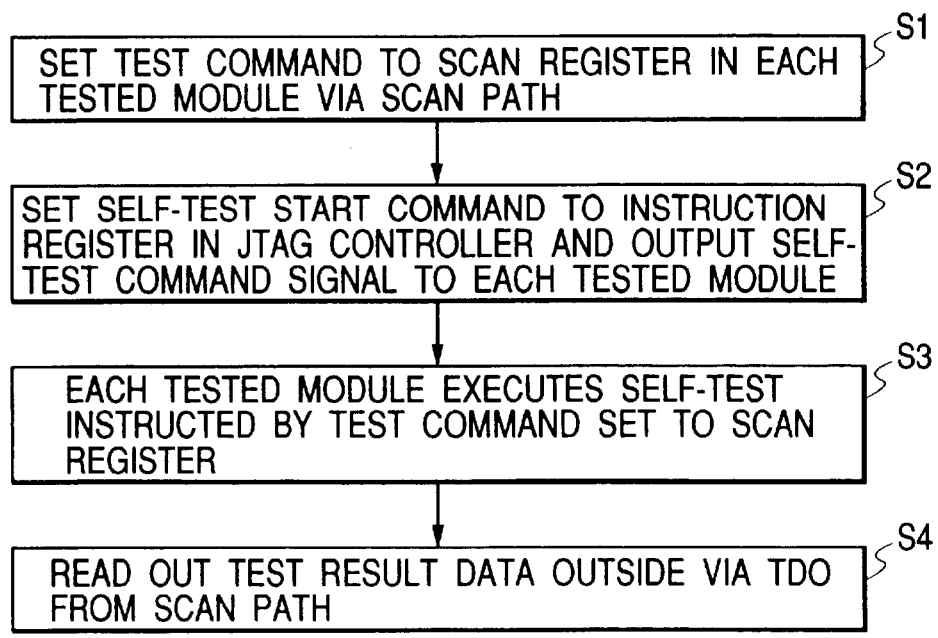
FIG. 5 is a flowchart illustrating one example of a test control sequence of a tested circuit by a JTAG controller.

One example of the sequence of test control of the tested circuits 21 through 24 by the JTAG controller 14 is shown in FIG. 5.

Test commands are first set to the scan registers 41 of the tested modules 21 through 24 through the scan path 20 respectively (S1). That is, the state of the test mode select terminal TMS is changed so that the test commands are successively serially inputted to the shift register 60 from the test data input terminal TDI and transferred in parallel to the data register 65. Thereafter, the test commands are serially outputted from the data register 65 to the scan path 20 by the number of bits for the transferred data in synchronism with the scan path control clock signal 50. This operation is repeated until the test commands are respectively set to all the scan registers 41 which needs the setting of the test commands.

Next, the state of the test mode select terminal TMS is changed. In this condition, a self-test start command is successively serially inputted from the test data input terminal TDI to the shift register 60, which transfers the same in parallel to the instruction register 64. The instruction decoder 66 decodes the self-test start command and supplies a self-test command signal 52 to each of the tested modules 21 through 24 (S2). The tested modules 21 through 24 respectively start self testing in parallel according to the contents corresponding to the test commands set to the scan registers 41 (S3). Data obtained by the test operation is compressed by each pattern compressor 44. The compressed test result data is loaded into its corresponding scan register 41 under the condition that a test operation end signal outputted from each test pattern generator 43 is enabled.

Next, the state of the test mode select terminal TMS is changed so that data outputted from the scan registers is successively serially inputted to the data register 65. The serially-inputted data is outputted to the outside from the test data output terminal TDO via the shift register 60 and the multiplexer 62 (S4).

According to the microcomputer 1 self-testable using JTAG, which has been described above with reference to FIG. 2, the following operation and effects can be obtained.

When the tested modules 21 through 24 are tested, test commands are externally inputted to the JTAG controller 14. They can be loaded into their corresponding scan paths of all the tested modules 21 through 24 through the scan path 20. In this case, the same test command may be supplied to all the tested modules or different test commands may be supplied to them respectively. Thereafter, a self-test command signal 52 is supplied to each individual tested modules 21 through 24 through the control terminals 32, so that the tested modules 21 through 24 can perform test operations according to their test commands in parallel. Test result data 56 is held by each of the scan registers 41 and thereafter outputted to the test data output terminal TDO from the JTAG controller 14 through the scan path 20. Thus, the self-test operations of the tested modules 21 through 24 can be parallelized so that a device test time for the entire microcomputer 1 can be shortened. Since the JTAG controller 14, which performs the input and output of test commands 53 and test result data 56 to and from the tested modules 21 through 24, can be shared between the tested modules 21 through 24, it can contribute to a reduction in logical and physical scale of each circuit necessary for testing.

Since the test pattern generator 43 and the pattern compressor 44 are used for the test control circuit 42, respective information contents such as the test control information sent from the JTAG controller 14 to each scan register 41 and the test result data sent from each scan register 41 to the JTAG controller 14 can be reduced, thus making it possible to contribute to an improvement in test efficiency even in this point.

Since the control terminals 32 for the plurality of tested modules 21 through 24 are connected in common so as to supply the self-test command signal 52 therethrough, instructions for the test operations can be given to the plurality of tested modules in parallel and besides the number of signals for their instructions can be also limited to the minimum.

When the cache memory 3 and/or the internal memory 6 like the DRAM are included in one tested module, the above-described advantageous effect that the efficiency of a memory test which requires time for testing, is improved and the efficiency of a device test is improved, can be exploited to the full. Since the local memory 12 is also included in each tested module, a memory test can be efficiently effected even on the local memory which is unable to be subjected to testing through the common bus 5.

The JTAG controller 14, which performs the input/output of signals in accordance with a procedure which complies with the standard of IEEEE1149.1., is used for boundary scan. Since such a JTAG controller as used for boundary scan is appropriated to the input/output of commands and data for the device test, it is of use to effectively utilize the JTAG controller or further reduce the scale of the circuit for the device test.

Figure 6:
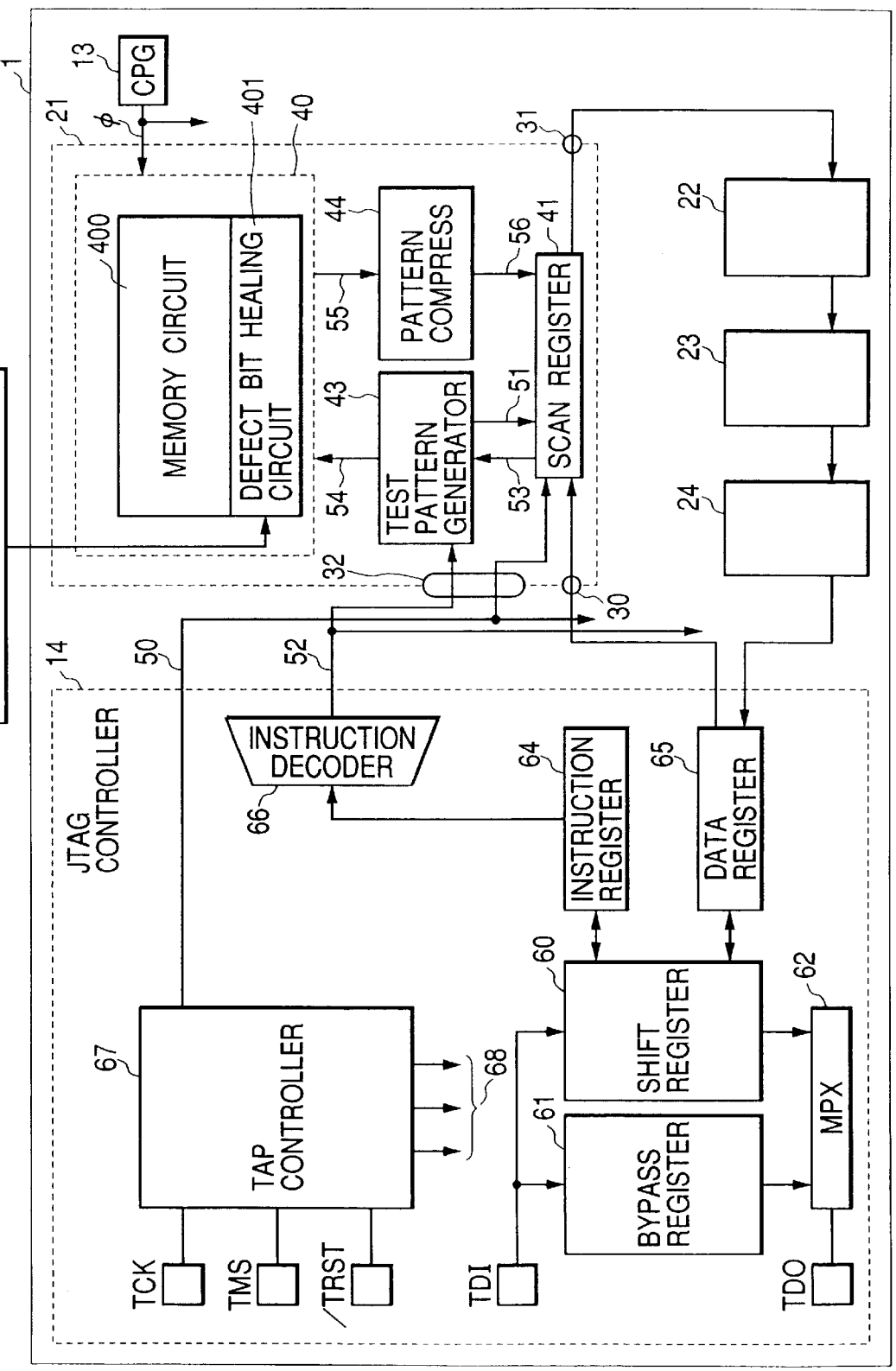
FIG. 6 is a block diagram of a microcomputer wherein a tested module employed in the microcomputer shown in FIG. 1 is set as a memory such as an internal memory, a cache memory or a local memory.

A case in which the tested module 21 provided within the microcomputer 1 shown in FIG. 1 is used as a memory such as the internal memory 6, cache memory 3 or local memory 12 or the like, is illustrated in FIG. 6 by way of example. A tested circuit 40 includes a memory circuit 400 and a defective or defect bit healing circuit 401. Although the details of the memory circuit 400 are not shown in the drawing in particular, for example, select terminals of memory cells are electrically connected to their corresponding word lines, and data terminals thereof are electrically connected to their corresponding bit lines. The corresponding word line is selected by a row address decoder and the corresponding bit line is selected by a column switch circuit and a column decoder. Each memory cell selected by them is allowed to conduct over a common data line or the like. Upon a data reading operation, stored information read out into the common data line is amplified by a main amplifier or the like, followed by being outputted to the outside, whereas upon a write operation, written data is supplied to its corresponding memory cell through the common data line. Redundant memory cells, redundant word lines or redundant bit lines or the like are provided to relieve or heal the defects of the memory cells, bit lines and word lines or the like. Now consider where a defective memory cell is replaced by the redundant memory cell. When, for example, the word line for the corresponding defective memory cell is selected, the corresponding word line is prohibited from being selected, and the redundant word line is selected as an alternative to it. The defect bit healing circuit 401 is provided to replace the selection of such a defective portion with the selection of the redundant one. Each defect address is programmed into the defect bit healing circuit 401. Thus, when an access to the corresponding programmed address is detected, such control as to replace the defect with the redundant one is performed. While an electric fuse may be used to program such a defect address, an electrically writable or programmable non-volatile storage element is used in the present example. For example, a memory cell transistor having a control gate, a floating gate, a source and a drain, such as used in a flash memory can be adopted. Control on the writing of data into such a non-volatile memory cell can be carried out by a write control signal 402.

Figure 7:
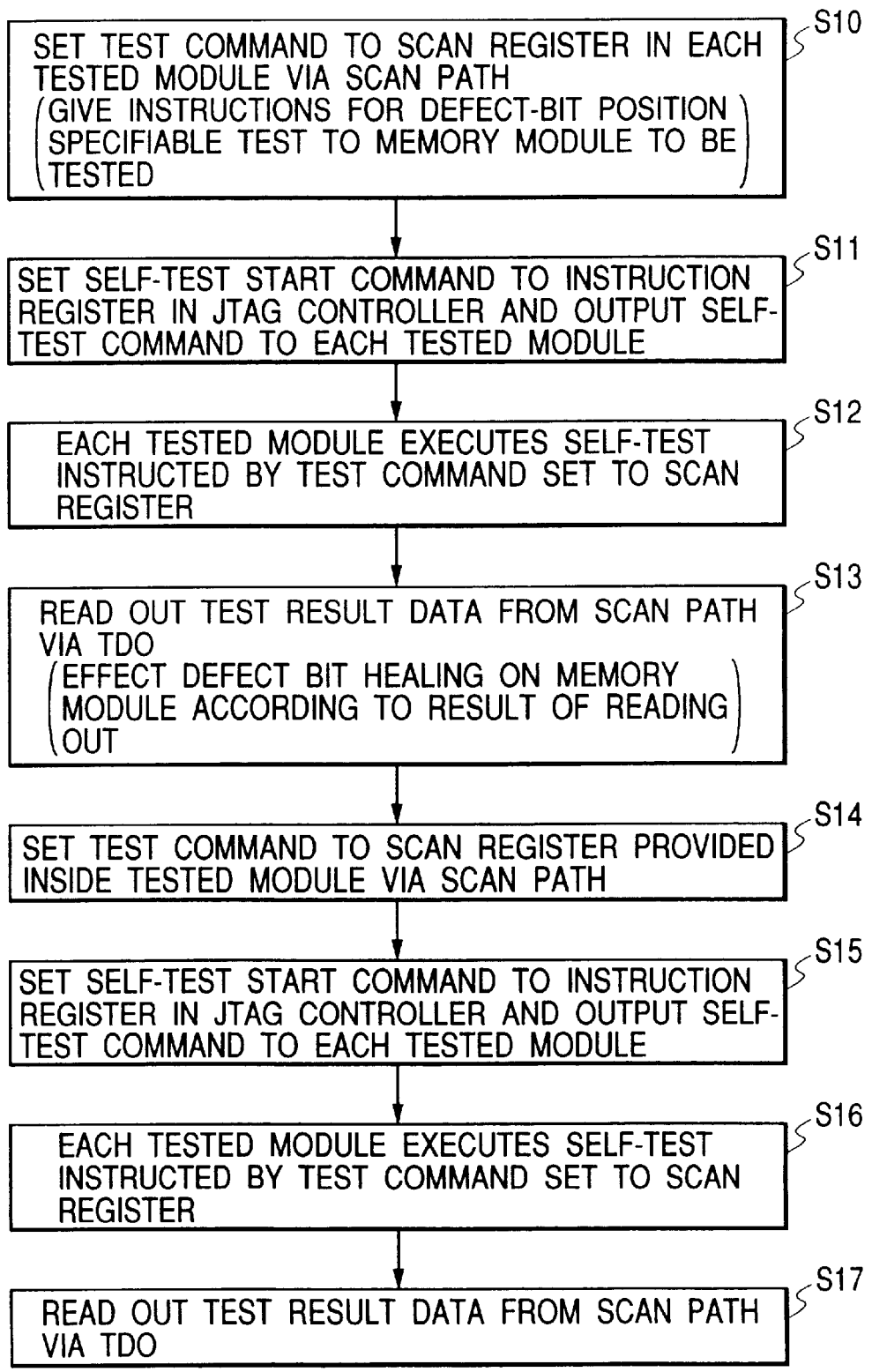
FIG. 7 is a flowchart showing one example of a test control sequence for the microcomputer shown in FIG. 6.

One example of the sequence of test control on the microcomputer shown in FIG. 6 is shown in FIG. 7.

First of all, test commands are first set to respective scan registers 41 of tested modules 21 through 24 through a scan path 20 respectively. A test command, which allows various marching tests capable of specifying the position of each detective bit to be executed, is supplied to the tested module 21 defined as a memory module in particular (S10). Next, a self-test start command is set to an instruction register 64. An instruction decoder 66 decodes the set self-test start command and supplies a self-test command signal 52 to each of the tested modules 21 through 24 (S11). The tested modules 21 through 24 start self tests in parallel according to the contents corresponding to the test commands set to the scan registers 41 respectively. Data obtained by such test operations is compressed by their corresponding pattern compressors 44, so that the compressed test result data is respectively loaded into the scan registers 41 under the condition that test operation end signals outputted from test pattern generators 43 are respectively enabled (S12).

Next, the state of a test mode select terminal TMS is changed. In this condition, the data stored in the scan registers is successively serially inputted to a data register 65 through the scan path. The serially-inputted data is outputted to the outside from a test data output terminal TDO by way of a shift register 60 and a multiplexer 62. If a defect occurs in the memory module 21 at this time, then an address corresponding to the pointed defect is programmed into the defective bit healing circuit 401 according to the write control signal 402 (S13). Further, the following are done again to verity whether the relief or healing for its defect is effective (S14). Test commands are respectively set to the scan registers 41 of the tested modules 21 through 24. A self-test start command is set to give self-test instructions to each of the test modules 21 through 24 (S15). The tested modules 21 through 24 performs parallel self tests according to the test commands set thereto respectively (S16). Further, test result data is outputted to the outside (S17).

If it is possible to carry out the defect healing by using the non-volatile memory cell as described above, then the device test is performed according to the test of the microcomputer 1. When the defect is detected by doing so, the write control signal 402 is controlled as it is, whereby a portion up to the processing of a defect healing program can be done in the form of a part of the device test.

Figure 8:
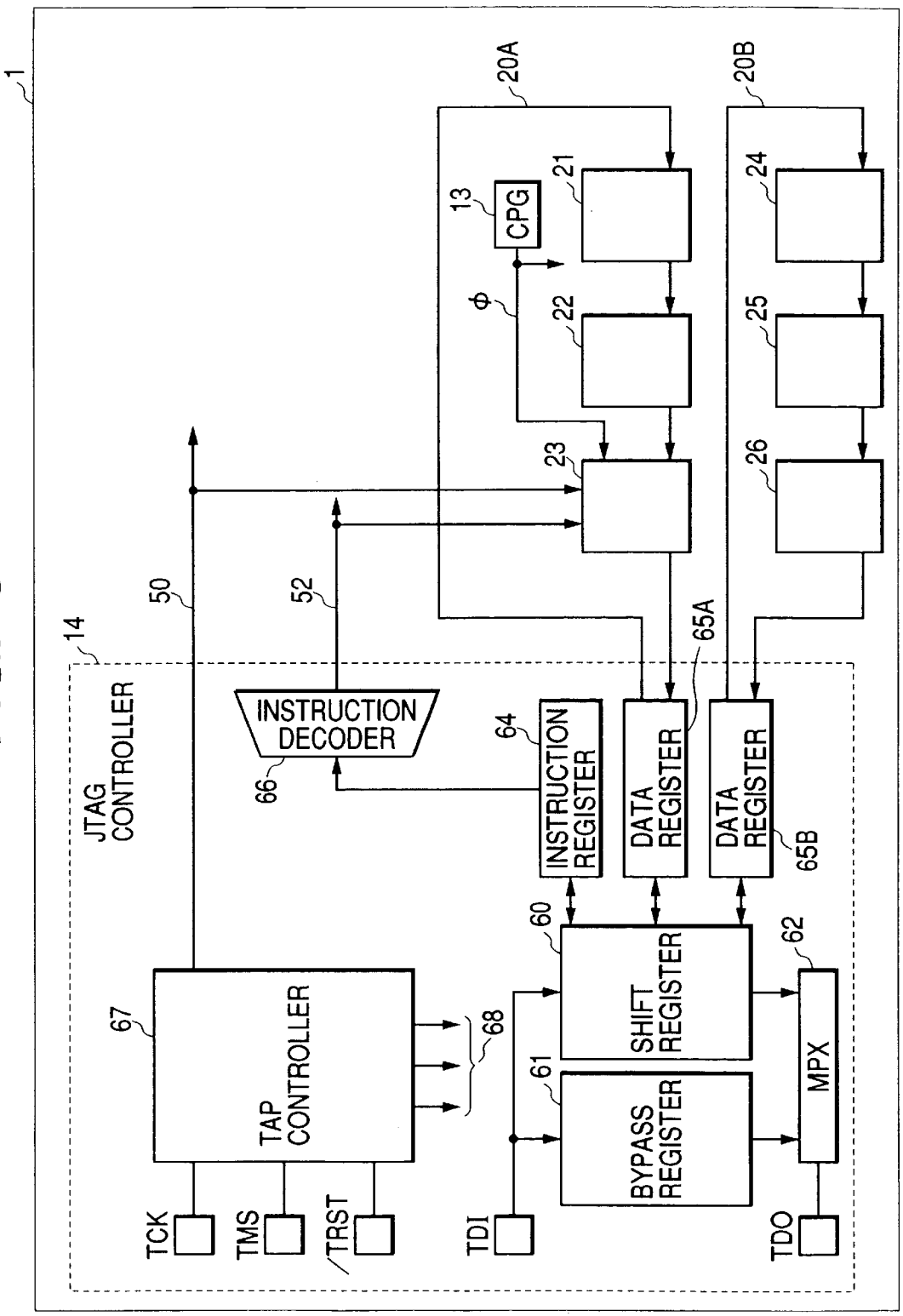
FIG. 8 is a block diagram illustrating one example of a microcomputer in which a scan path is divided into two systems.

One example of a microcomputer in which a scan path is divided into two systems, is shown in FIG. 8. The scan paths divided into the two are designated at numerals 20A and 20B respectively. Tested modules 21 through 23 are connected to the scan path 20A, whereas tested modules 24 through 26 are connected to the scan path 20B. Correspondingly, data registers are also provided as 65A and 65B every scan paths 20A and 20B. If the scan path is divided into plural systems, then the time required to transfer the test commands and test result data through the scan paths can be further shortened. Since other configurations are similar to those shown in FIG. 1, their detained description will be omitted.

Figure 9:
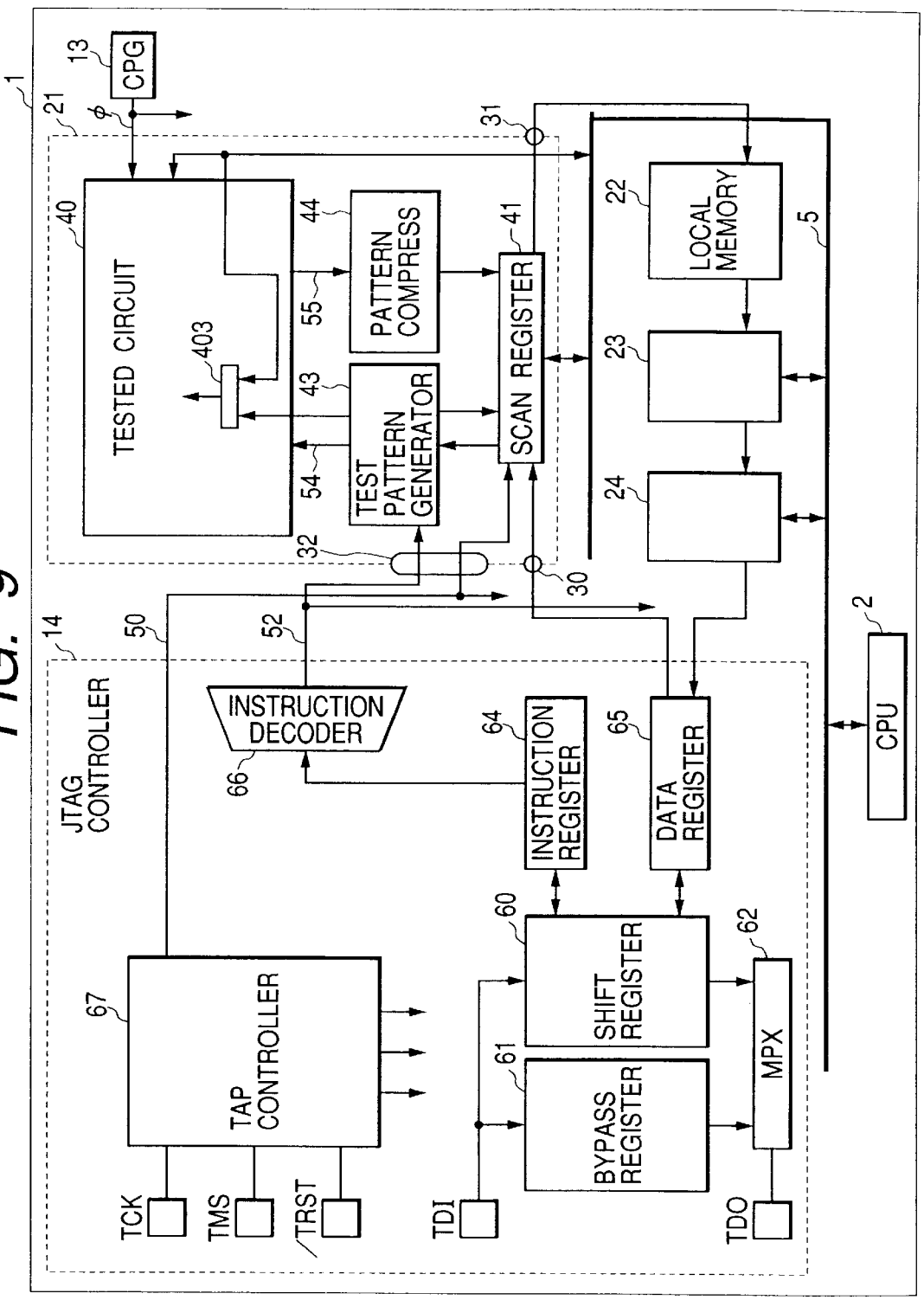
FIG. 9 is a block diagram of a microcomputer which allows a CPU to access a scan register.

A microcomputer, which allows access to each scan register by a CPU, is shown in FIG. 9. In FIG. 9, a CPU 2 is capable of obtaining access to a scan register 41 of a tested module 21 through an internal bus 5. According to such a configuration, the scan register 41 is placed in an address space of the CPU 2. Thus, the CPU 2 is capable of issuing a test command and thereby self-testing the tested module 21. It should be noted that in such a configuration, a disadvantage arises in that each scan register 41 used for the device test alone occupies part of a memory space. Thus, such a configuration will be applied to the demand that a defect or failure due to a change with the passage of time, subsequent to the implementation of the microcomputer to a system must be detected in particular.

Further, the example shown in FIG. 9 does not mean that all testing data to be supplied to the tested circuit 40 must be outputted from a test pattern generator 43. The data may be supplied from the bus 5 or another tested module. At this time, the data is selected by a selector 403 and may be used for self testing. Selective control on the selector 403 may be carried out in accordance with the test command loaded into each scan register 41.

A description will next be made of a case in which design data for the circuit module 21 or design data for the microcomputer 1 itself is provided as a so-called IP module from the viewpoint of the facilitation of the design of the microcomputer 1.

The data for the circuit module provided as each IP module is data for specifying each tested module shown in FIG. 1 for example, which includes graphics pattern data or function descriptive data such as HDL, RTL for forming, on the semiconductor chip, a test input terminal 30, a test output terminal 31, a test control terminal 32, a normal interface terminal, a tested circuit 40 connected to the normal interface terminal, a scan register 41 for inputting information from the test input terminal 30 and outputting it to the test output terminal 31, and a test control circuit 42 for receiving a start for a test on the tested circuit 40 from the control terminal 32 to thereby perform the test by using a test command given to the scan register 41 and supplying data about the result of test to its corresponding scan register. The graphics pattern data may include mask pattern data or electron beam drawing data or the like. The function descriptive data is so-called program data, which is capable of specifying a circuit or the like in symbol representation by being read into a predetermined design tool.

Further, the data for the circuit module provided as each IP module may be ones provided for the tested circuit 40 and test control circuit 42 shown in FIG. 1, for example as different circuit module data. If the plurality of tested circuits 40 respectively have terminals connected to their corresponding test control circuits 42 supplied with circuit module data of the tested circuits 40 in this case, then the circuit module data of the test control circuits 42 can be used in common. Owing to the adoption of the so-provided form, the test control circuits 42 can be utilized in combination with their corresponding tested circuits 40 as needed. It is also possible to reduce the amount of the provided IP module data.

Further, the scale of the IP module may be an LSI level like the microcomputer 1 shown in FIG. 1 by way of example. At this time, the circuit module data is respectively provided for a plurality of circuit modules different in tested circuit from one another. Further, test path data defined as graphics pattern data or function descriptive data for forming, on a semiconductor chip with the plurality of circuit modules formed thereon, a test path 20 which constitutes a test signal chain by connecting a test output terminal 31 of one circuit module to its corresponding test input terminal 30 of another circuit module is provided for each circuit module. Furthermore, test interface circuit information is further included as graphics pattern data or function descriptive data for forming on the semiconductor chip, a JTAG controller 14 for supplying each test command from the outside to the scan register 41 through the test path 20 and outputting the test result data from the scan register 41 to the outside through the test path 20.

Figure 10:
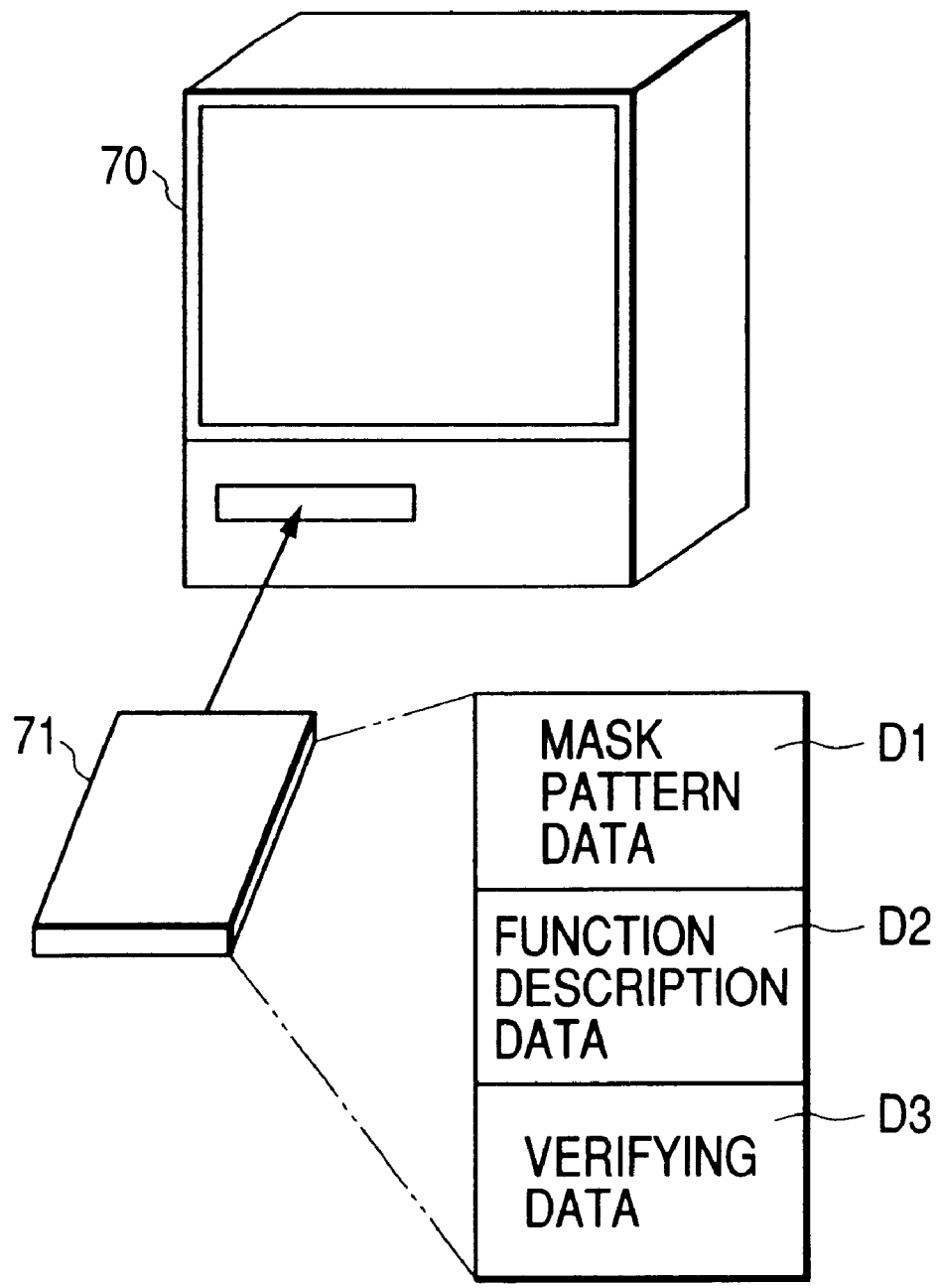
FIG. 10 is a perspective view showing a recording medium in which data for a IP module is stored so as to be capable of being read by a computer, and the computer.

As shown in FIG. 10 by way of example, the data of these IP modules is data for designing a integrated circuit to be formed on a semiconductor chip, by using a computer 70 like a design tool. The data is stored in and provided for a storage medium 71 such as a CD-ROM, a DVD-ROM, a magnetic tape or the like so as to be readable by the computer. The data for the hard IP module corresponding to the tested module 21 shown in FIG. 1 by way of example includes mask pattern data D1 for constituting the tested module 21, function descriptive data D2 for the tested module 21, and verifying data D3 for permitting simulation which have taken into consideration the relations with other modules when data for the IP module of the tested module 21 is applied to design LSI.

While the invention made above by the present inventors has been described specifically by the embodiments, the present invention is not necessarily limited to them. It is needless to say that various changes can be made thereto within the scope not departing from the substance thereof.

For example, the type of circuit module incorporated into a semiconductor integrated circuit is not limited to the above and may suitably be changed. Further, the semiconductor integrated circuit is not limited to a microcomputer and may be a system on-chip system LSI for printer control, communication control, disk drive control or the like. A test interface circuit is not limited to a JTAG-based circuit used as a serial input/output circuit utilizing a signal at a test mode select terminal TMS as a state transition command. Another interface type circuit may be used.

Advantageous effects obtained by typical ones of the inventions disclosed in the present application will be described in brief as follows.

That is, according to a semiconductor integrated circuit according to the present invention, the amounts of test data to be supplied from outside for the purpose of testing a plurality of circuit modules and test result data to be outputted to the outside can be reduced. Further, the time required to test the plurality of circuit modules can be shortened.

Further, the scale of a test circuit, which needs to test a plurality of circuit modules, can be reduced to the utmost.

According to a computer-readable recording medium according to the present invention, which has stored design data for an integrated circuit therein, it is possible to facilitate the design of a semiconductor integrated circuit which implements the shortening of a test time interval and a reduction in the scale of a test circuit.

What is claimed is:

1. A semiconductor integrated circuit, comprising:
    a single semiconductor chip including,
        a plurality of circuit modules each provided with a test input terminal, a test output terminal and a test control terminal;
        a test path which connects the test output terminal of one circuit module to the test input terminal of the other circuit module to thereby form a test signal chain; and
        a test interface circuit connected to the test path; and
    wherein said each circuit module includes a tested circuit, a test register circuit and a test control circuit,
    said test register circuit is connected to the test path through the test input terminal and the test output terminal and permits input and output to and from the test control circuit;
    said test control circuit receives a start signal for a test on said each tested circuit from the test control terminal to thereby perform the test using test control information outputted from the test register circuit and supplies information about the result of test to the test register circuit;
    said each of test control circuit includes a test pattern generator and a compressor, and said test pattern generator generates a test pattern for said tested circuit in a circuit module, based on the test control information inputted to the test register circuit, and
    said test interface circuit supplies the test control information to the test register circuit from an outside through the test path and outputs the information about the result of test from the test register circuit to the outside through the test path.

2. The semiconductor integrated circuit according to claim 1,
    wherein said compressor compresses the result of operation of the tested circuit to thereby generate information about the result of test and supplies the same to the test register circuit.

3. The semiconductor integrated circuit according to claim 2, wherein said test register circuit is a plural-bits type shift register including a serial input terminal connected to the test input terminal, a serial output terminal connected to the test output terminal, a parallel output terminal connected to the test pattern generator, and a parallel input terminal connected to the compressor.

4. The semiconductor integrated circuit according to claim 1, wherein the control terminals of said plurality of circuit modules are connected in common and coupled to the test interface circuit.

5. The semiconductor integrated circuit according to claim 1, wherein said test path series-connects the plurality of test register circuits with the test interface circuit as a base point and constitutes a scan path fed back to the test interface circuit.

6. The semiconductor integrated circuit according to claim 5, wherein said test path includes paths provided in plural form, which connect the test register circuits in series.

7. The semiconductor integrated circuit according to claim 5, wherein said test interface circuit includes a clock terminal, a mode terminal, a data input terminal and a data output terminal as external terminals, and when a first operation mode is specified through the mode terminal, said test interface circuit receives information supplied to the data input terminal and provides the received information to the test path, when a second operation mode is specified through the mode terminal, said test interface circuit receives information supplied to the data input terminal and decodes the received information to thereby output a control signal to the test control terminal, and when a third operation mode is specified through the mode terminal, said test interface circuit receives information of each test register circuit through the test path and outputs the same from the data output terminal to the outside.

8. The semiconductor integrated circuit according to claim 7, wherein said test interface circuit performs the input/output of a signal in accordance with a procedure which complies with the standard of IEEE1149.1.

9. The semiconductor integrated circuit as claim in claim 1, wherein said test control information is a test command for giving instructions for the contents of each test operation.

10. The semiconductor integrated circuit according to claim 1, wherein one of said plurality of circuit modules is a cache memory.

11. The semiconductor integrated circuit according to of claim 1, wherein one of said plurality of circuit modules is a dynamic random access memory.

12. The semiconductor integrated circuit according to claim 1, wherein said plurality of circuit modules include a first circuit module connected to a common bus, and a second circuit module connected to the first circuit module and disconnected from the common bus.

13. The semiconductor integrated circuit according to claim 12, wherein said second circuit module is a local memory.

* * * * *